(12) United States Patent
Kang et al.

(10) Patent No.: US 12,727,229 B2
(45) Date of Patent: Sep. 1, 2026

(54) EXTENDED SOURCE/DRAIN CONTACT FOR SHIFTED DRAIN VOLTAGE FOR A BACKSIDE POWER DISTRIBUTION NETWORK

(71) Applicant: INTERNATIONAL BUSINESS MACHINES CORPORATION, Armonk, NY (US)

(72) Inventors: Tsung-Sheng Kang, Ballston Lake, NY (US); Tao Li, Slingerlands, NY (US); Ruilong Xie, Niskayuna, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 85 days.

(21) Appl. No.: 18/069,970

(22) Filed: Dec. 21, 2022

(65) Prior Publication Data

US 2024/0213337 A1 Jun. 27, 2024

(51) Int. Cl.
*H10D 64/23* (2025.01)
*H10W 20/41* (2026.01)

(52) U.S. Cl.
CPC ........ *H10D 64/257* (2025.01); *H10W 20/427* (2026.01)

(58) Field of Classification Search
CPC .. H10D 86/441; H10D 64/605; H10D 86/443; H10D 86/011; H10D 86/201; H10D 86/215; H10D 64/251; H10D 64/256; H10D 64/2565; H10D 64/257; H10D 64/252; H10D 64/254; H10D 64/258; H10D 64/259; H10W 10/50; H10W 10/051; H10W 20/20; H10W 20/40; H10W 20/021; H10W 20/023; H10W 20/0242; H10W 20/0698; H10W 20/42; H10W 20/481; H10W 20/427; H10W 20/435; H10W 20/43
See application file for complete search history.

(56) References Cited

U.S. PATENT DOCUMENTS

| | | | |
|---|---|---|---|
| 3,962,052 | A | 6/1976 | Abbas et al. |
| 5,811,868 | A | 9/1998 | Bertin et al. |
| 5,814,889 | A | 9/1998 | Gaul |
| 5,998,292 | A | 12/1999 | Black et al. |
| 6,198,168 | B1 | 3/2001 | Geusic et al. |
| 7,276,787 | B2 | 10/2007 | Edelstein et al. |
| 7,935,571 | B2 | 5/2011 | Ramiah et al. |
| 8,276,002 | B2 | 9/2012 | Dennard et al. |

(Continued)

OTHER PUBLICATIONS

In, H. et al., "Efficient Backside Power Delivery for High-Performance Computing Systems", IEEE Transactions on Very Large Scale Integration (VLSI) Systems (2022), 9 pgs.

(Continued)

*Primary Examiner* — Thanhha S Pham
(74) *Attorney, Agent, or Firm* — L. Jeffrey Kelly

(57) ABSTRACT

A semiconductor device includes at least a direct backside contact between a source line and a source epitaxial growth and/or a drain line and a drain epitaxial growth. A clock signal line contact via can connect a gate to a backside clock signal line. The clock signal line contact via is surrounded by a deep STI fill to prevent shorting between the clock signal line and the source and/or drain lines in the backside power rail.

20 Claims, 16 Drawing Sheets

(56) References Cited

U.S. PATENT DOCUMENTS

| | | | |
|---|---|---|---|
| 8,344,512 | B2 | 1/2013 | Knickerbocker |
| 8,445,918 | B2 | 5/2013 | Bartley et al. |
| 10,043,798 | B2 | 8/2018 | Cosemans et al. |
| 10,586,765 | B2 | 3/2020 | Smith et al. |
| 10,636,739 | B2 | 4/2020 | Beyne et al. |
| 10,700,207 | B2 | 6/2020 | Chen et al. |
| 10,797,139 | B2 | 10/2020 | Morrow et al. |
| 10,833,089 | B2 | 11/2020 | Pille et al. |
| 10,985,064 | B2 | 4/2021 | Zhang et al. |
| 11,257,764 | B2 | 2/2022 | Hiblot et al. |
| 11,289,602 | B2 | 3/2022 | Chiang et al. |
| 11,817,394 | B2 | 11/2023 | Farooq et al. |
| 12,046,643 | B2 | 7/2024 | Frougier et al. |
| 12,106,969 | B2 | 10/2024 | Xie et al. |
| 12,136,655 | B2 | 11/2024 | Xie et al. |
| 12,482,746 | B2 | 11/2025 | Anderson et al. |
| 12,550,711 | B2 | 2/2026 | Dechene et al. |
| 2018/0145030 | A1 | 5/2018 | Beyne et al. |
| 2018/0218973 | A1 | 8/2018 | Nelson et al. |
| 2019/0164882 | A1 | 5/2019 | Chen et al. |
| 2020/0105671 | A1 | 4/2020 | Lai et al. |
| 2020/0266169 | A1 | 8/2020 | Kang et al. |
| 2020/0373242 | A1 | 11/2020 | Hiblot et al. |
| 2021/0104435 | A1 | 4/2021 | Son et al. |
| 2021/0111115 | A1 | 4/2021 | Morrow et al. |
| 2021/0118798 | A1 | 4/2021 | Liebmann et al. |
| 2021/0134721 | A1 | 5/2021 | Chiang et al. |
| 2021/0202385 | A1 | 7/2021 | Huang et al. |
| 2021/0202472 | A1 | 7/2021 | Thomson et al. |
| 2021/0351079 | A1 | 11/2021 | Su et al. |
| 2021/0391421 | A1 | 12/2021 | Chu et al. |
| 2022/0165856 | A1 | 5/2022 | Yu et al. |
| 2022/0293750 | A1 * | 9/2022 | Cheng ................ H10D 30/6729 |

OTHER PUBLICATIONS

Ryckaert, J. et al., “Extending the Roadmap Beyond 3nm Through System Scaling Boosters: A Case Study on Buried Power Rail and Backside Power Delivery”, IEEE Electron Devices Technology and Manufacturing Conference (EDTM—2019), 3 pgs.

* cited by examiner

140
Y2

118
142
110
142
Y1

140
X2

110
140
140
X1

160
166
162
168
X1

140
166
164
168
162
160
X2

166
158
168
164
Y1

166
168
140
160
162
Y2

EXTENDED SOURCE/DRAIN CONTACT FOR SHIFTED DRAIN VOLTAGE FOR A BACKSIDE POWER DISTRIBUTION NETWORK

BACKGROUND

The present disclosure generally relates to fabrication methods and resulting structures for semiconductor devices, and more particularly, to an improved process and resulting structures for an extended source/drain (S/D) contact for shifted drain voltage ($V_{DD}$) to prevent backside signal from power line shorting for a backside power distribution network (BSPDN).

When there is direct S/D backside contact and clock signal backside contact nearby, in order to prevent $V_{DD}/V_{SS}$ short to the clock signal line, only half of the $V_{DD}$ has direct backside contact, which increase the contact resistance.

SUMMARY

In one embodiment, a semiconductor device includes a direct backside contact between a source line, at a backside of the semiconductor device, and a source region of the semiconductor device and/or between a drain line, at the backside of the semiconductor device, and a drain region of the semiconductor device. A clock signal line contact via connects a gate to a backside clock signal line. The clock signal line contact via is surrounded by a deep shallow trench isolation (STI) fill. The deep STI fill can prevent shorting between the clock signal line contact via and the direct backside contact.

In one embodiment, a semiconductor device includes a direct backside contact between a a drain line and a drain region and a clock signal line contact via connecting a gate to a backside clock signal line. The semiconductor device can further include an extension, integral with the direct backside contact, formed at a source and/or drain contact end of the direct backside contact, the extension providing a contact surface area for electrically connecting the direct backside contact with the drain line.

In one embodiment, a semiconductor device includes a direct backside contact between a drain line on a backside of the semiconductor device and a drain region of the semiconductor device. A clock signal line contact via connects a gate to a backside clock signal line and a deep STI fill surrounding the clock signal line contact via. The semiconductor device includes an extension, integral with the direct backside contact, formed at a source and/or drain contact end of the direct backside contact, the extension providing a contact surface area for electrically connecting the direct backside contact with the respective source line and/or drain line. The extension extends in a first direction toward a central longitudinal axis of the drain line and the extension further extends in a second direction parallel with the central longitudinal axis.

In one embodiment, a method of forming a semiconductor device includes forming a deep shallow trench isolation (STI) patterning between a N-type field effect transistor (FET) post to a P-type FET post nanosheet patterning, where the nanosheet patterning stops at an etch stop layer. The method further includes filling the deep STI patterning with a dielectric material. A direct backside contact is formed between a source line and/or a drain line and a respective source region and/or drain region of the semiconductor device. A gate is connected to a backside clock signal contact with a clock signal line contact via, wherein the dielectric material surrounds the clock signal line contact via and prevents shorting between the direct backside contact and the clock signal line contact via.

By virtue of the concepts discussed herein, processes and resulting structures for an extended S/D contact for shifted $V_{DD}$ are provided that prevent backside signal from power line shorting for a BSPDN. Such a system improves conventional S/D backside contact structures by providing a way to extend direct backside S/D and signal contact area when connected to the $V_{DD}/V_{SS}$ and the clock signal line to reduce contact resistance.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Figure 1:
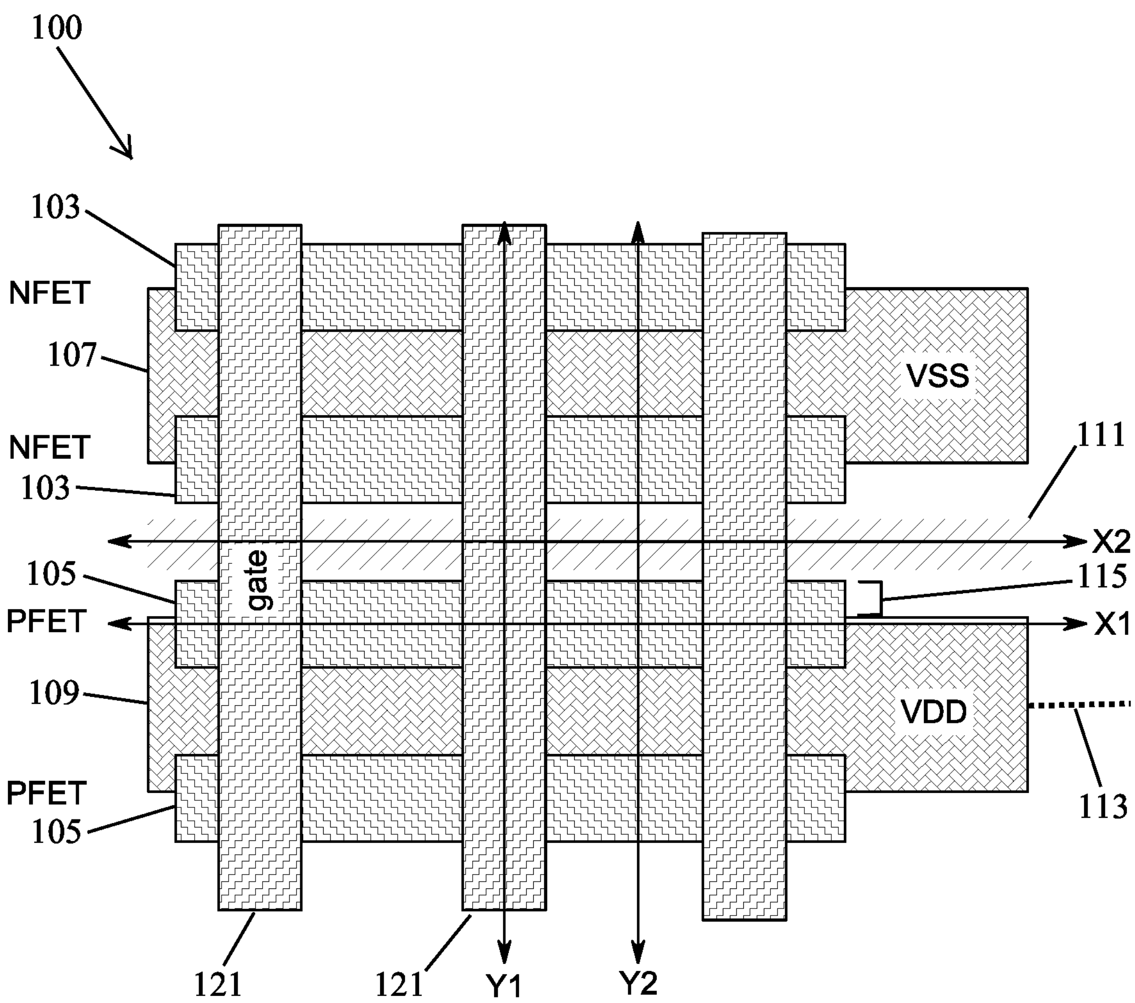
FIG. 1 depicts a top-down reference view of a semiconductor structure according to an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as “front,” “back,” “top,” “bottom,” “beneath,” “below,” “lower,” above,” “upper,” “side,” “left,” “right,” and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as “below” or “beneath” other elements or features would then be oriented “above” the other elements or features. Thus, for example, the term “below” can encompass both an orientation that is above, as well as, below. The device may be otherwise oriented (rotated 90 degrees or viewed or referenced at other orientations) and the spatially relative descriptors used herein should be interpreted accordingly.

As used herein, the terms “lateral” and “horizontal” describe an orientation parallel to a first surface of a chip.

As used herein, the term “vertical” describes an orientation that is arranged perpendicular to the first surface of a chip, chip carrier, or semiconductor body.

As used herein, the terms “coupled” and/or “electrically coupled” are not meant to mean that the elements must be directly coupled together—intervening elements may be provided between the “coupled” or “electrically coupled” elements. In contrast, if an element is referred to as being “directly connected” or “directly coupled” to another element, there are no intervening elements present. The term “electrically connected” refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term “and/or” includes any and all combinations of one or more of the associated listed items.

The terms “epitaxial growth and/or deposition” and “epitaxially formed and/or grown” mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. In some embodiments, epitaxial growth and/or deposition processes can be selective to forming on semiconductor surface, and may or may not deposit material on other exposed surfaces, such as silicon dioxide or silicon nitride surfaces.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

In some embodiments, etching mask layer(s) may be provided, and the layers that are not protected thereby are removed. For example, as is understood in the art, a mask layer, sometimes referred to as a photomask, may be provided by forming a layer of photoresist material on another layer, exposing the photoresist material to a pattern of light, and developing the exposed photoresist material. An etching process, such as a reactive ion etch (RIE), may be used to form patterns (e.g., openings) by removing portions of another layer. After etching, the mask layer may be removed using a conventional plasma ashing or stripping process. Accordingly, the pattern of the mask layer facilitates the removal of another layer, such as an amorphous $SiO_2$ layer and/or a conductive oxide diffusion barrier, for example, in areas where the mask layer has not been deposited.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

FIG. 1 depicts a top down view of a semiconductor structure 100 in its completed form. Axes are labeled X1, X2, Y1 and Y2, from which various views, as provided in FIGS. 2 through 17D, are taken. The semiconductor structure 100 can include a N-channel field effect transistor 103 (NFET 103), a P-channel field effect transistor 105 (PFET 105), a plurality of gates 121, a $V_{SS}$ line 107 and a $V_{DD}$ line 109 and a clock signal line 111. As can be seen, the $V_{DD}$ line 109 may have a longitudinal axis 113 and may be offset from being directly below the PFET 105. The offset 115 spaces the $V_{DD}$ line 109 apart from the clock signal line 111 in the power rail, as described in greater detail below, to prevent shorting therebetween. A similar offset structure may be found between the $V_{SS}$ line 107 and the NFET 103.

Turning now to a more detailed description of fabrication operations and resulting structures according to aspects of the present disclosure, FIGS. 2-17D depict a semiconductor structure 100 after various fabrication operations in accordance with aspects of the present disclosure. Although the cross-sectional diagrams depicted in FIGS. 2-17D are two-dimensional, it is understood that the diagrams depicted in FIGS. 2-17D represent three-dimensional structures. The top-down reference view 101 shown in FIG. 1 provides a reference point for the various cross-sectional views: X1-view (perpendicular to gates in channel region), X2-view (perpendicular to gates in clock signal region), Y1-view (parallel to gates in channel region), and Y2-view (parallel to gates in source/drain region) shown in FIGS. 2-17D.

Figure 2:
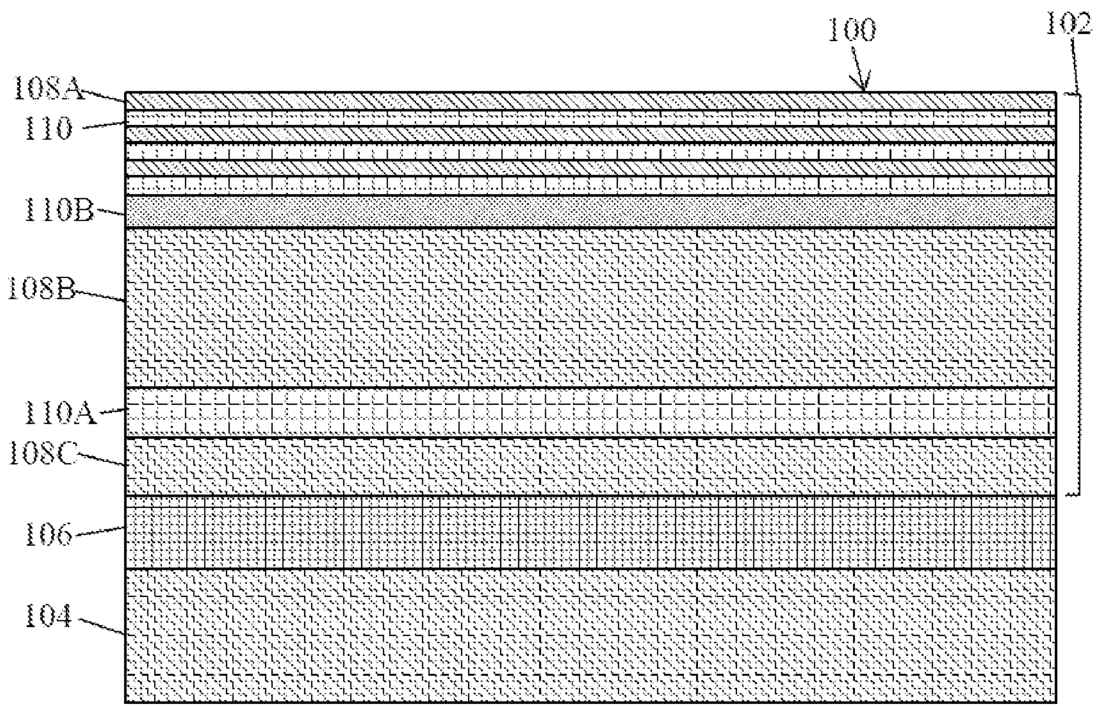
FIG. 2 depicts a cross-sectional view of the semiconductor structure of FIG. 1, taken along line Y1, illustrating a starting wafer used in a process according to an illustrative embodiment.

FIG. 2 depicts a cross-sectional view of the semiconductor structure 100 taken along the line X1 of the reference view 101 after an initial set of fabrication operations have been applied as part of a method of fabricating a final semiconductor device according to one or more embodiments. In some embodiments, one or more nanosheet stacks 102 are formed over a substrate 104.

To prevent over-etch that may damage the underlying metal lines during the fabrication process described below, an etch stop layer 106 may be used. Commonly used etch stop materials include silicon nitride, silicon carbide, silicon carbonitride, and the like.

The substrate 104 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments, the nanosheet stacks 102 can include one or more semiconductor layers 108A alternating with one or more sacrificial layers 110, including SiGe30 layer 110A and SiGe55 layer 110B. In some embodiments, the semiconductor layers 108A and the sacrificial layers 110 are epitaxially grown layers. It is understood that the nanosheet stacks 102 can include any number of nanosheets alternating with a corresponding number of sacrificial layers. For example, the nanosheet stacks 102 can include two nanosheets, five nanosheets, eight nanosheets, 30 nanosheets (e.g., 3D NAND), or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets).

The semiconductor layers 108A can be made of any suitable material such as, for example, monocrystalline silicon or silicon germanium. In some embodiments, the semiconductor layers 108A are silicon nanosheets. In some embodiments, the semiconductor layers 108A have a thickness of about 4 nm to about 10 nm, for example 6 nm, although other thicknesses are within the contemplated scope of the present disclosure. In some embodiments, the substrate 104 and the semiconductor layers 108A can be made of the same semiconductor material. In other embodiments, the substrate 104 can be made of a first semiconductor material, and the semiconductor layers 108A can be made of a second and/or third semiconductor material.

The sacrificial layers 110 can be silicon or silicon germanium layers, depending on the material of the semiconductor layers 108A to meet etch selectivity requirements. For example, in embodiments where the semiconductor layers 108A are silicon nanosheets, the sacrificial layers 110 can be silicon germanium layers. In embodiments where the semiconductor layers 108A are silicon germanium nanosheets, the sacrificial layers 110 can be silicon germanium layers having a germanium concentration that is greater than the germanium concentration in the semiconductor layers 108A. For example, if the semiconductor layers 108A are silicon germanium having a germanium concentration of 5 percent (sometimes referred to as SiGe5), the sacrificial layers 110 can be silicon germanium layers having a germanium concentration of about 25 (SiGe25), although other germanium concentrations are within the contemplated scope of the present disclosure. For example, the lower silicon germanium layer (SiGe30 layer 110A) in FIG. 2 may have a germanium concentration of about 30 (SiGe30) while the upper silicon germanium layer (SiGe55 layer 110B) in FIG. 2 may have a germanium concentration of about 55 (SiGe55). In some embodiments, the sacrificial layers 110 have a thickness of about 8 nm to about 15 nm, for example 10 nm, although other thicknesses are within the contemplated scope of the present disclosure. A semiconductor layer 108B can separate the SiGe30 layer 110A and the SiGe55 layer 110B. A semiconductor layer 180C can be disposed between the SiGe55 layer 110B and the etch stop layer 106.

Figure 3:
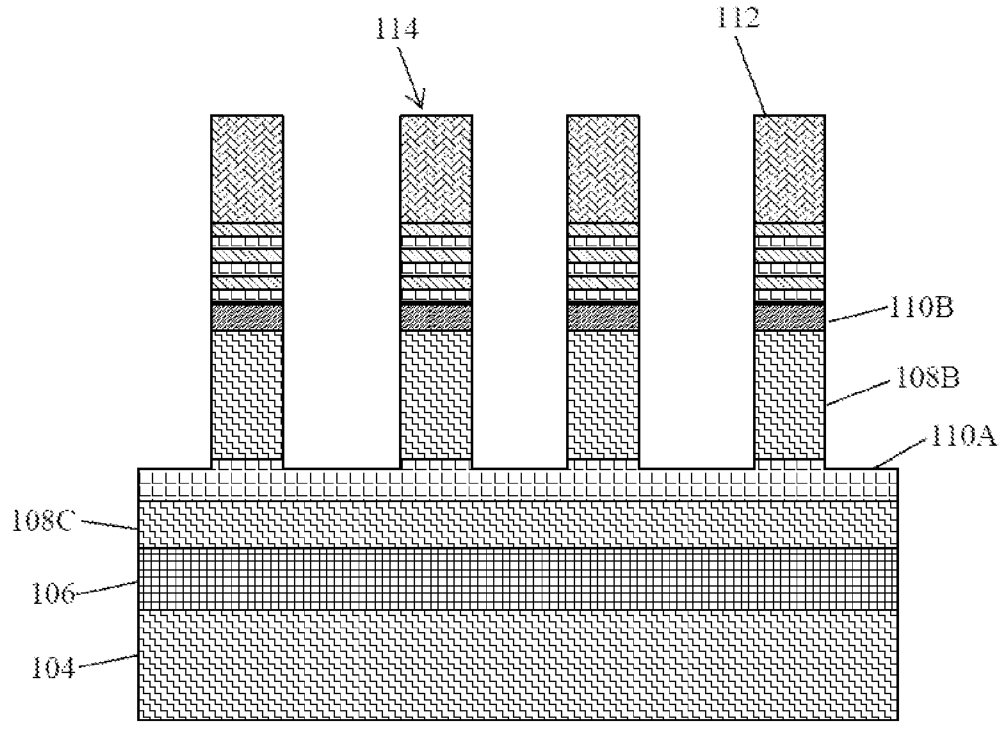
FIG. 3 depicts a cross-sectional view of the semiconductor structure of FIG. 1, taken along line Y1, illustrating nanosheet (NS) patterning used in a process according to an illustrative embodiment.

Referring to FIGS. 2 and 3, cross-sectional views along Y1 of FIG. 1 are shown, where portions of the nanosheet stacks 102 can be removed (exposing a surface of the SiGe30 layer 110A) to define the nanosheet stack width. In some embodiments, the width of the patterned nanosheet stacks 114 is about 10-100 nm, although other widths are within the contemplated scope of the present disclosure. A hardmask layer 112 may be applied to each desired location for the patterned nanosheet stacks 114. The hardmask layer 112 may be, for example, metal or dielectric. Exemplary materials include silicon dioxide, silicon carbide, titanium nitride, tantalum nitride, or the like.

Figure 4:
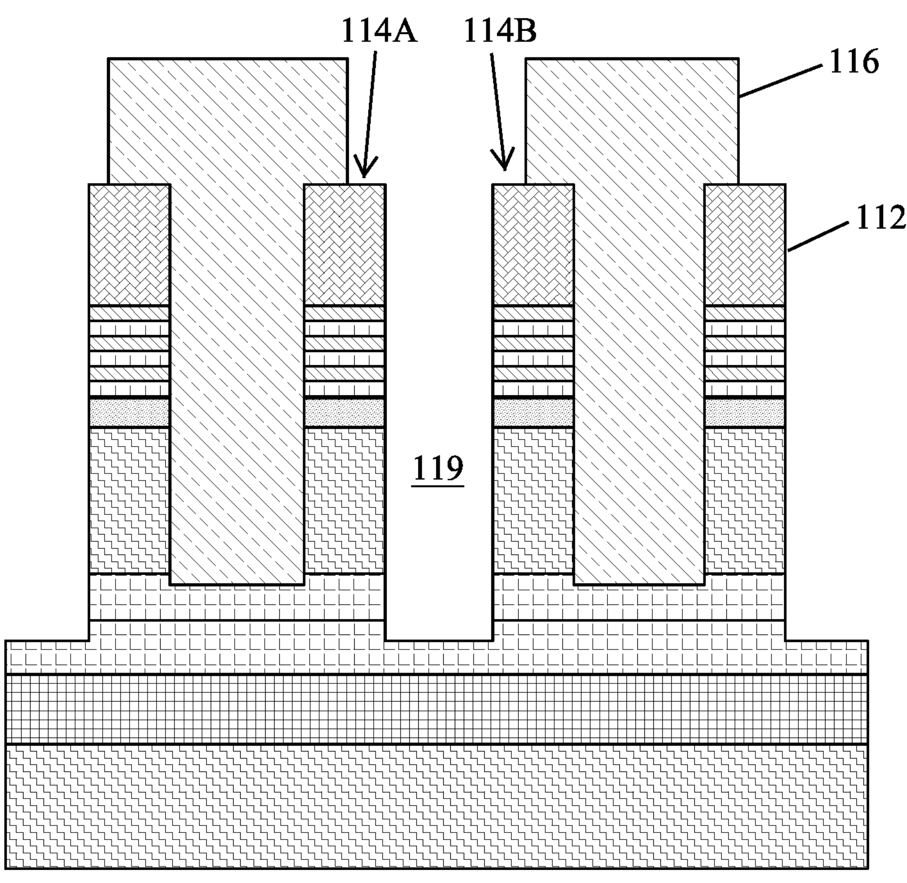
FIG. 4 depicts a cross-sectional view of the semiconductor structure of FIG. 1, taken along line Y1, illustrating deep shallow trench isolation (STI) patterning between the NFET and PFET, as used in a process according to an illustrative embodiment.

FIG. 4 illustrates a cross-sectional view taken along line Y1 of FIG. 1 where an OPL 116 may be applied between the patterned nanosheet stacks 114A of the NFET 103 and the patterned nanosheet stacks 114B of the PFET 105. Deep STI patterning 119 may be performed between the NFET 103 and the PFET 105.

Figure 5:
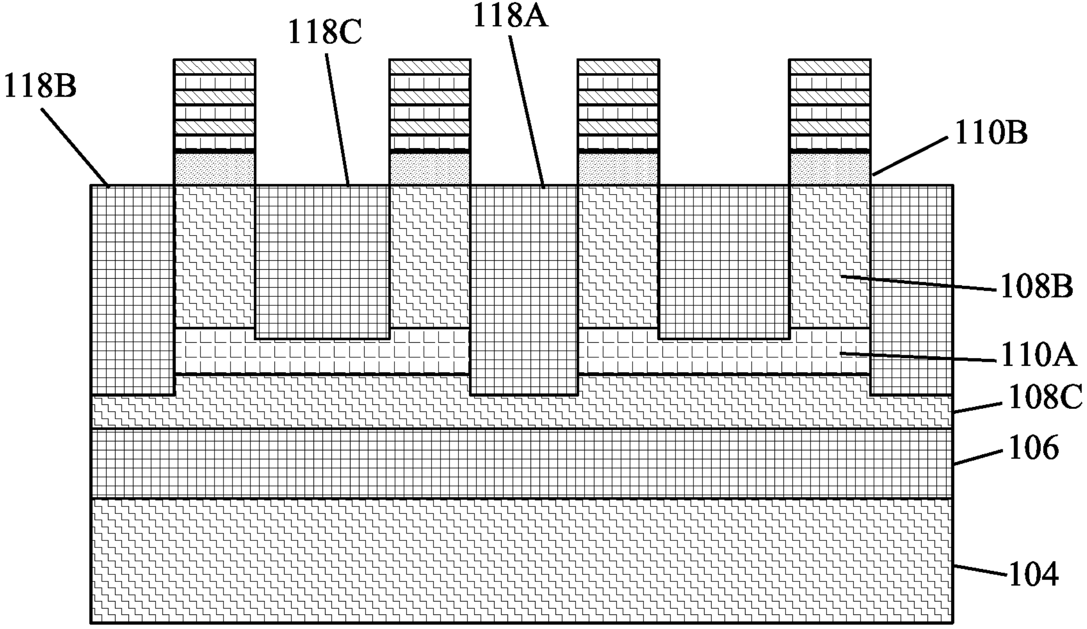
FIG. 5 depicts a cross-sectional view of the semiconductor structure of FIG. 1, taken along line Y1, illustrating STI fill, recess and hardmask (HM) removal, as used in a process according to an illustrative embodiment.
Figures 6A, 6B, 6C, 6D:
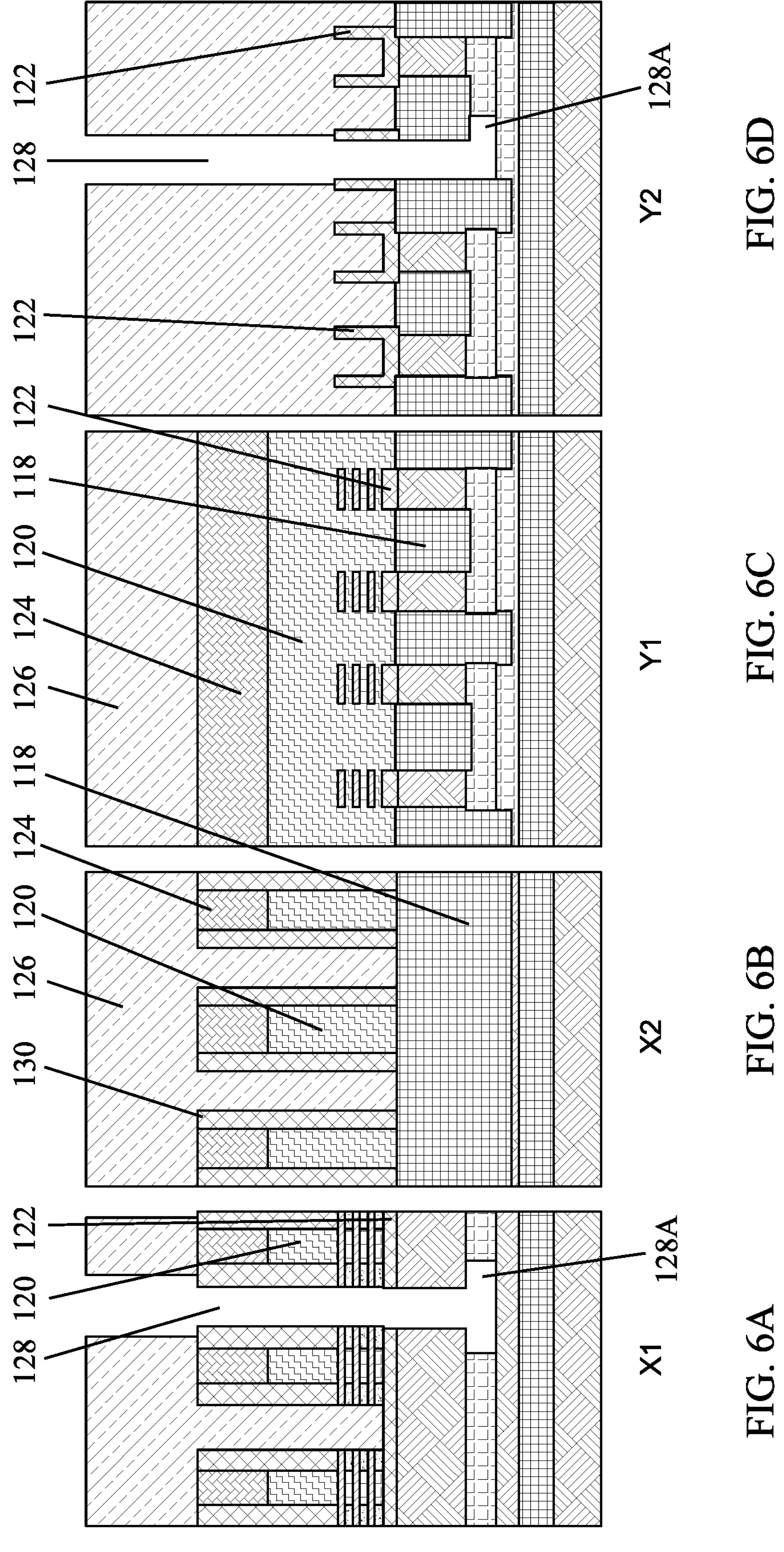
FIGS. 6A through 6D depict cross-sectional views of the semiconductor structure of FIG. 1, taken along lines X1, X2, Y1 and Y2, respectively, illustrating dummy gate formation, SiGe55 removal and bottom dielectric isolation (BDI) formation, NS recess, inner spacer formation, placeholder patterning and selective SiGe indentation, as used in a process according to an illustrative embodiment.
Figures 7A, 7B, 7C, 7D:
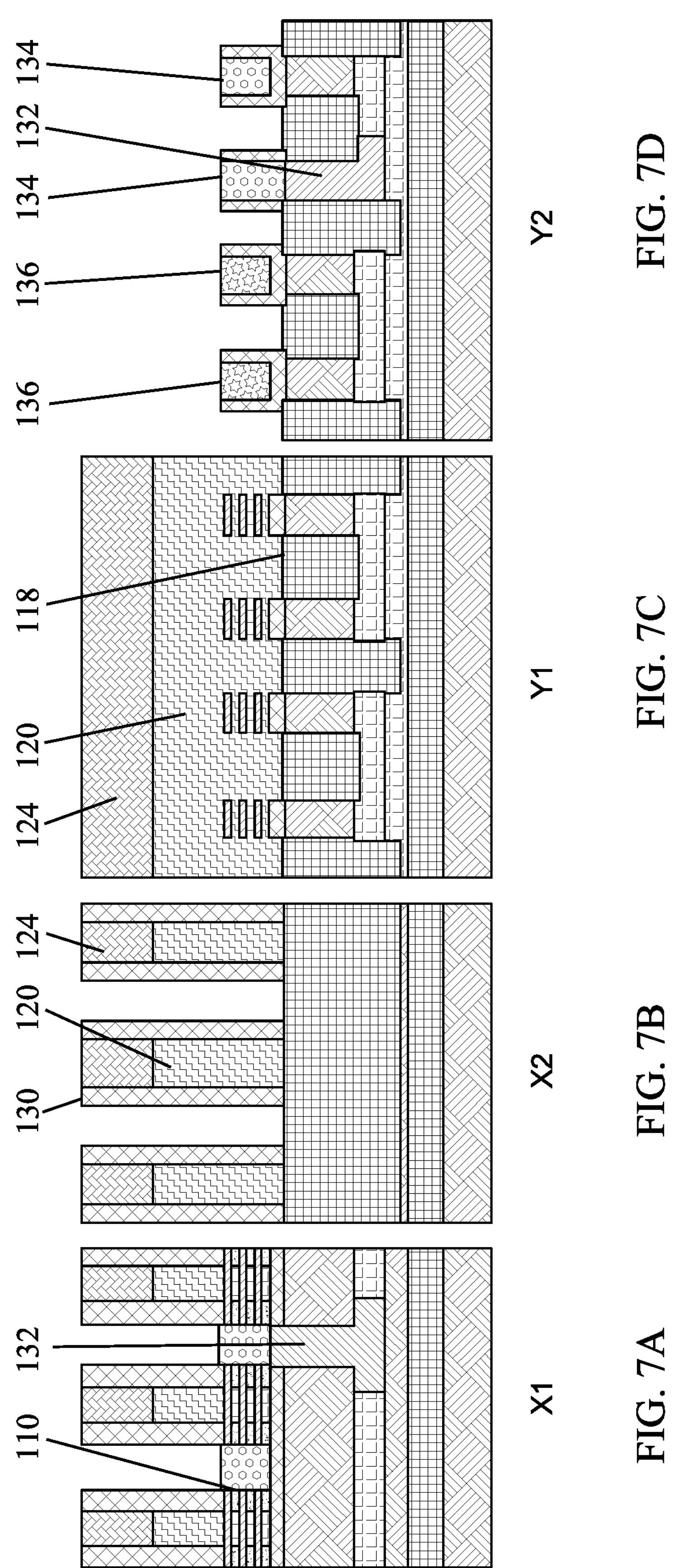
FIGS. 7A through 7D depict cross-sectional views of the semiconductor structure of FIG. 1, taken along lines X1, X2, Y1 and Y2, respectively, illustrating placeholder formation and S/D epi formation, as used in a process according to an illustrative embodiment.
Figures 8A, 8B, 8C, 8D:
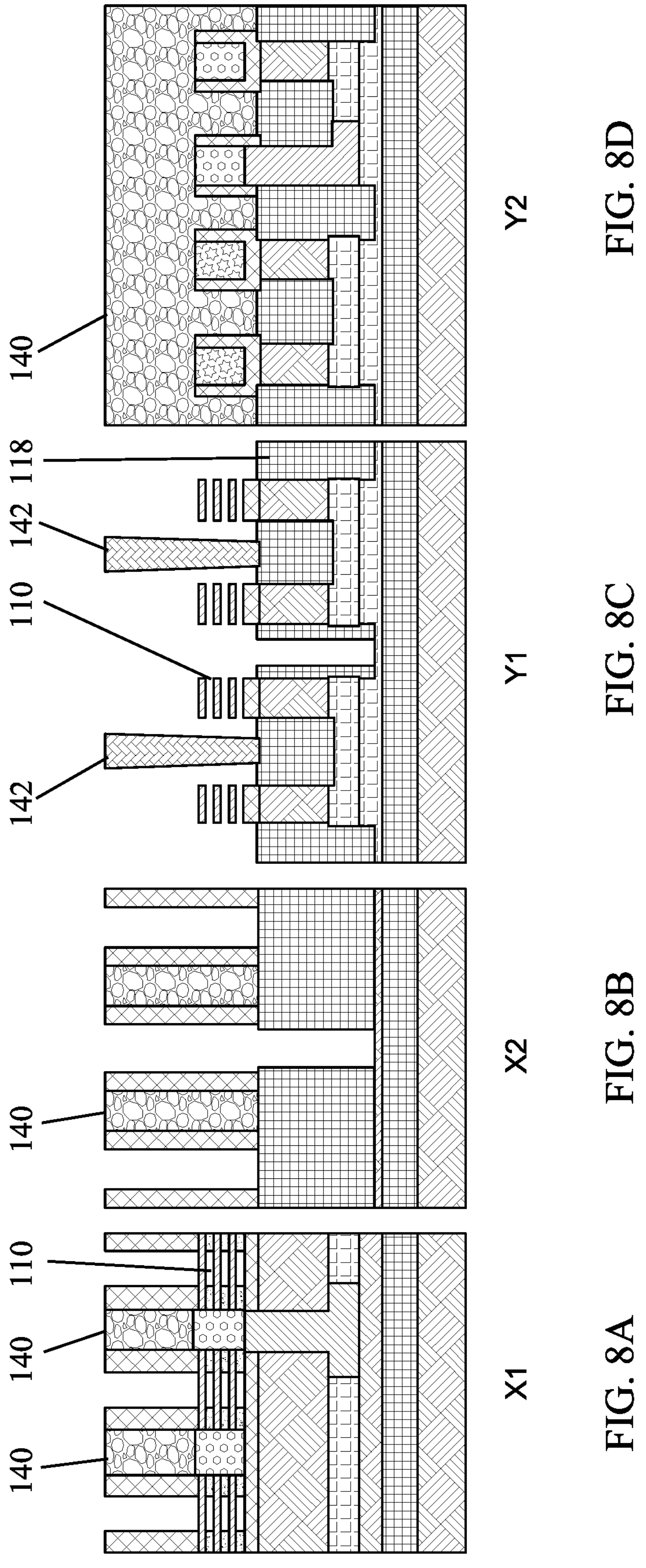
FIGS. 8A through 8D depict cross-sectional views of the semiconductor structure of FIG. 1, taken along lines X1, X2, Y1 and Y2, respectively, illustrating interlayer dielectric (ILD) fill/chemical mechanical polishing (CMP) cut, dummy gate removal and SiGe release, as used in a process according to an illustrative embodiment.
Figures 9A, 9B, 9C, 9D:
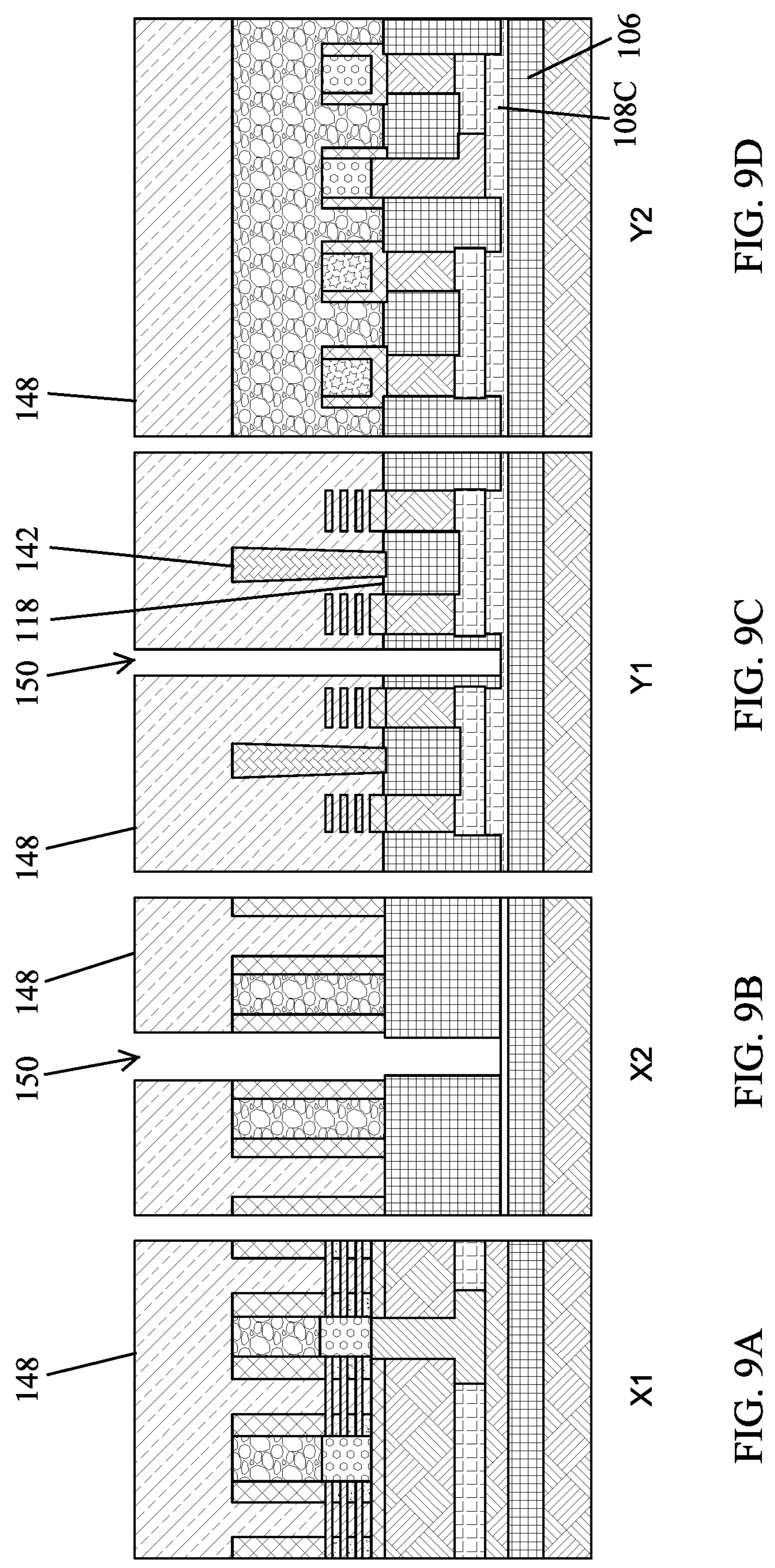
FIGS. 9A through 9D depict cross-sectional views of the semiconductor structure of FIG. 1, taken along lines X1, X2, Y1 and Y2, respectively, illustrating gate clock signal patterning, as used in a process according to an illustrative embodiment.
Figures 10A, 10B, 10C, 10D:
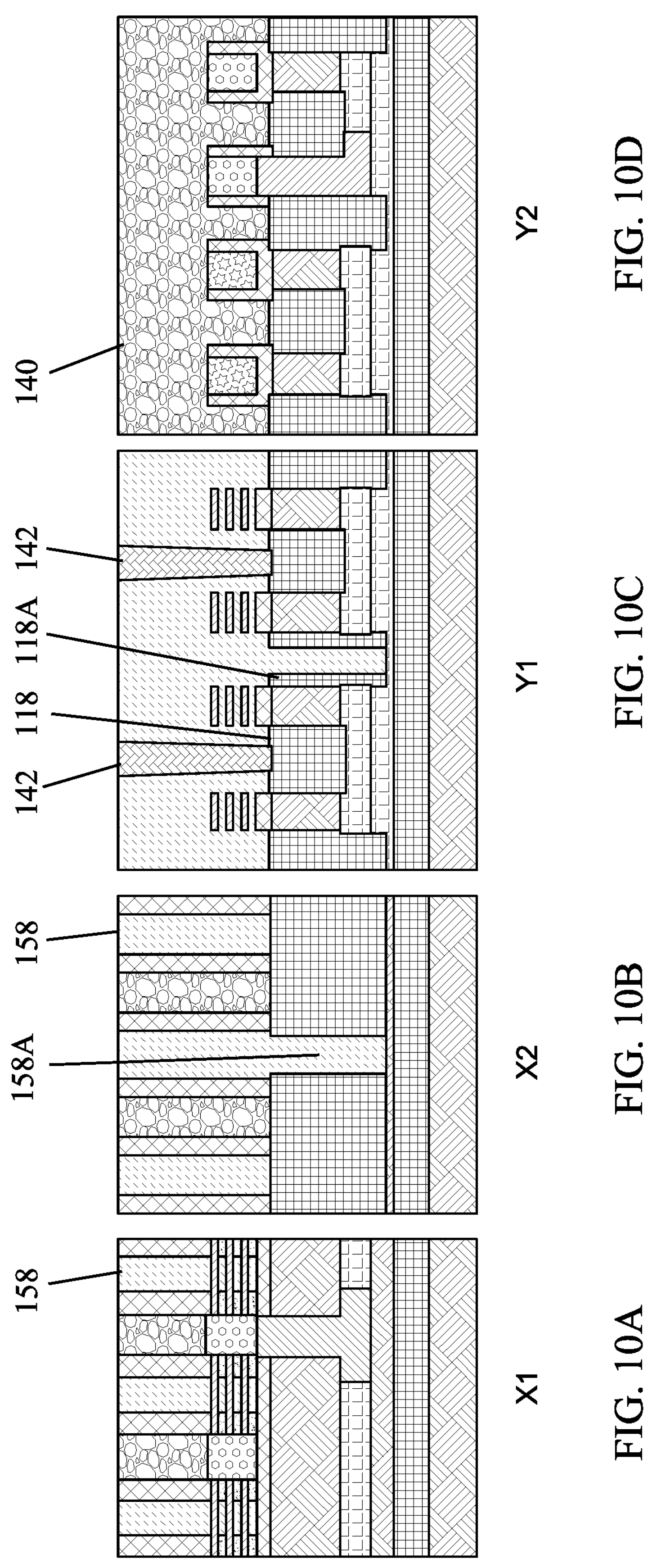
FIGS. 10A through 10D depict cross-sectional views of the semiconductor structure of FIG. 1, taken along lines X1, X2, Y1 and Y2, respectively, illustrating organic planarization layer (OPL) removal and replacement high-k metal gate (HKMG) formation, as used in a process according to an illustrative embodiment.
Figures 11A, 11B, 11C, 11D:
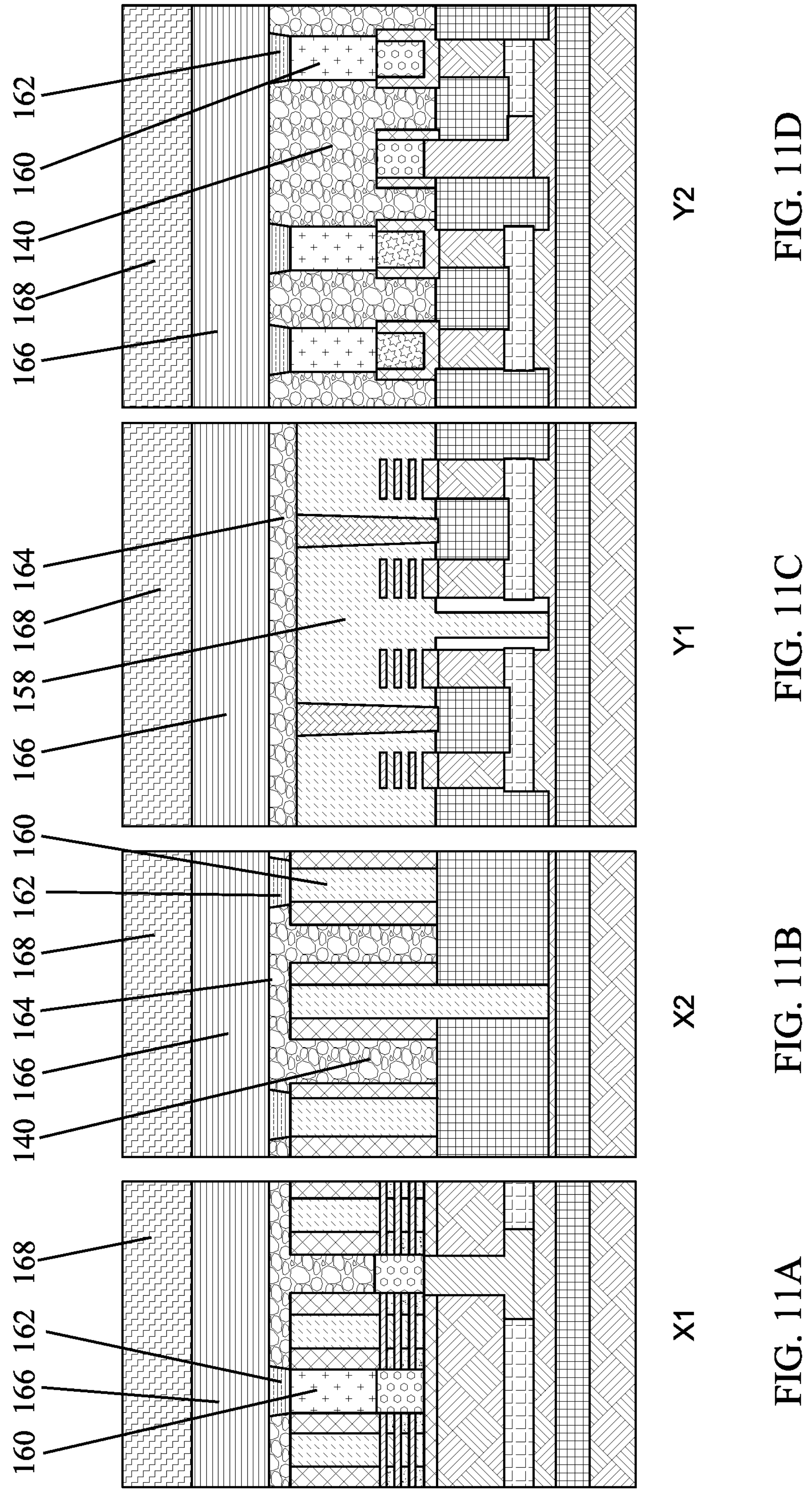
FIGS. 11A through 11D depict cross-sectional views of the semiconductor structure of FIG. 1, taken along lines X1, X2, Y1 and Y2, respectively, illustrating middle of line (MOL) line contact formation, backside end of line (BEOL) interconnect, and carrier wafer bonding, as used in a process according to an illustrative embodiment.
Figures 12A, 12B, 12C, 12D:
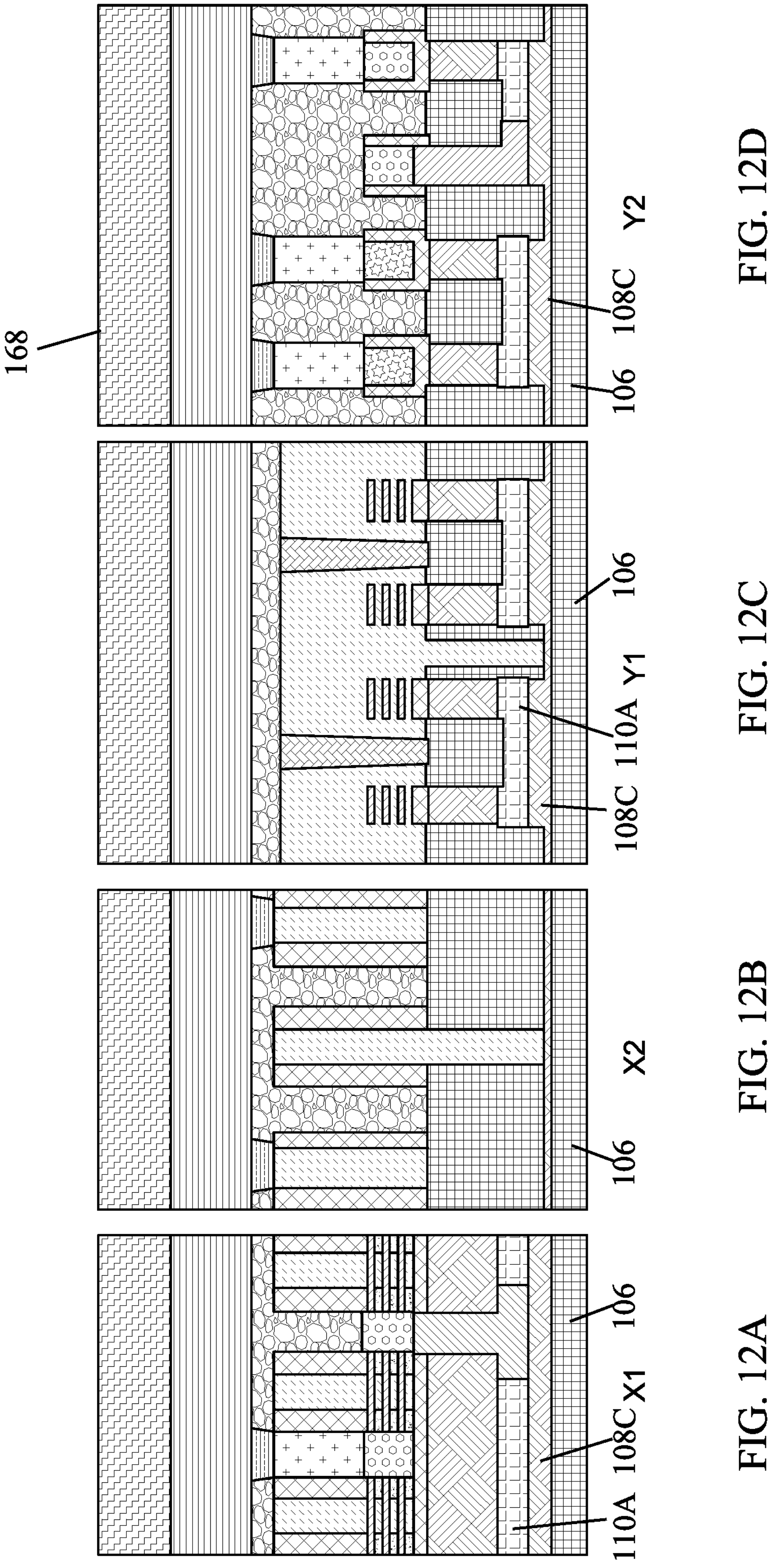
FIGS. 12A through 12D depict cross-sectional views of the semiconductor structure of FIG. 1, taken along lines X1, X2, Y1 and Y2, respectively, illustrating wafer flip, substrate grinding, CMP and selective wet etch, and stop on etch stop layer, as used in a process according to an illustrative embodiment.
Figures 13A, 13B, 13C, 13D:
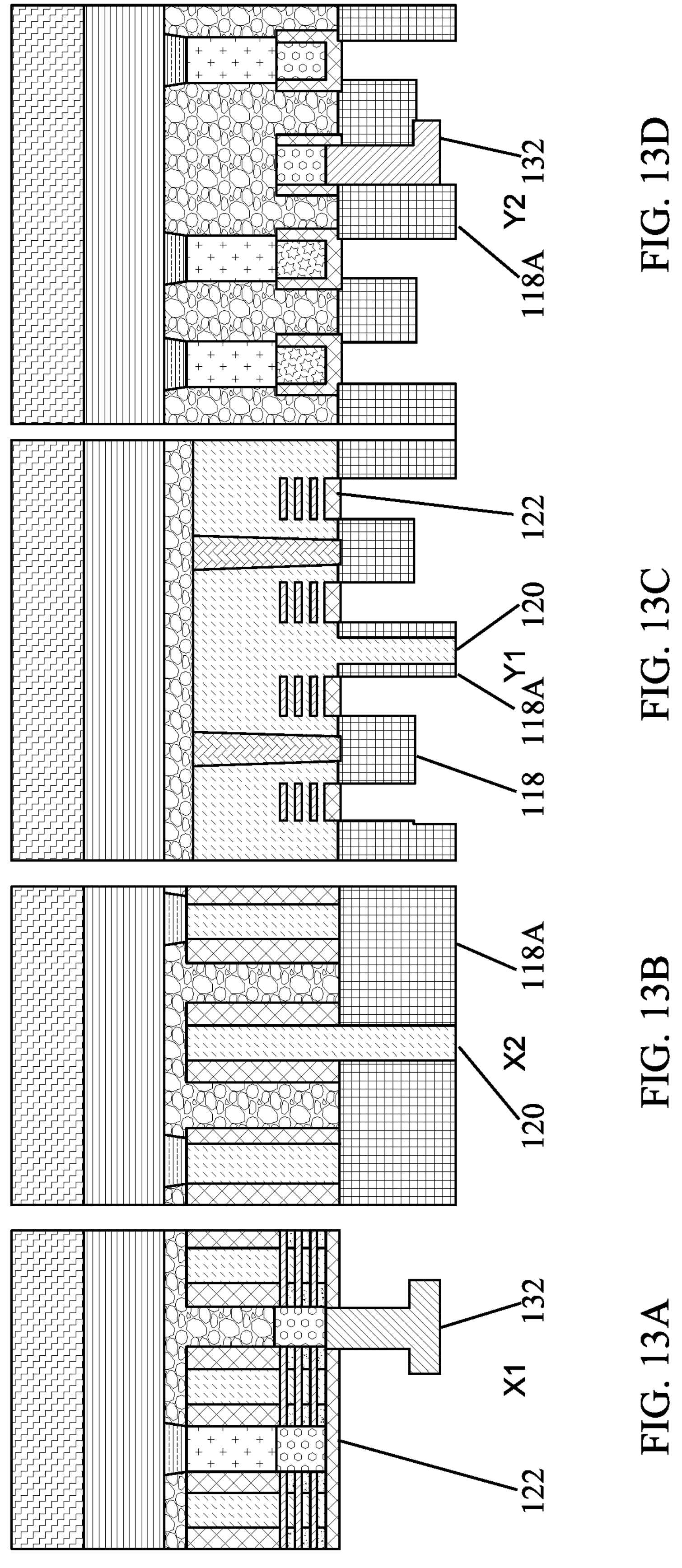
FIGS. 13A through 13D depict cross-sectional views of the semiconductor structure of FIG. 1, taken along lines X1, X2, Y1 and Y2, respectively, illustrating etch stop layer removal and remaining SiGe and Si removal, as used in a process according to an illustrative embodiment.
Figures 14A, 14B, 14C, 14D:
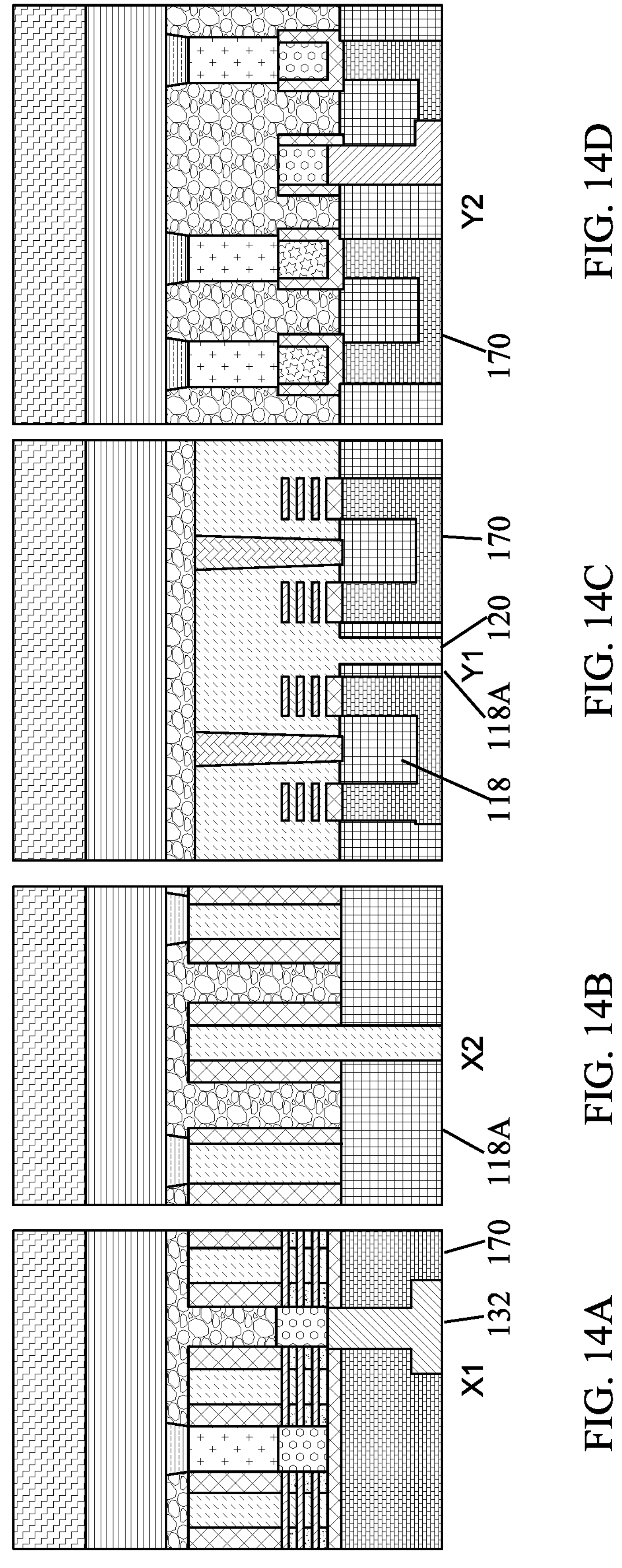
FIGS. 14A through 14D depict cross-sectional views of the semiconductor structure of FIG. 1, taken along lines X1, X2, Y1 and Y2, respectively, illustrating BEOL ILD deposition and CMP, as used in a process according to an illustrative embodiment.
Figures 15A, 15B, 15C, 15D:
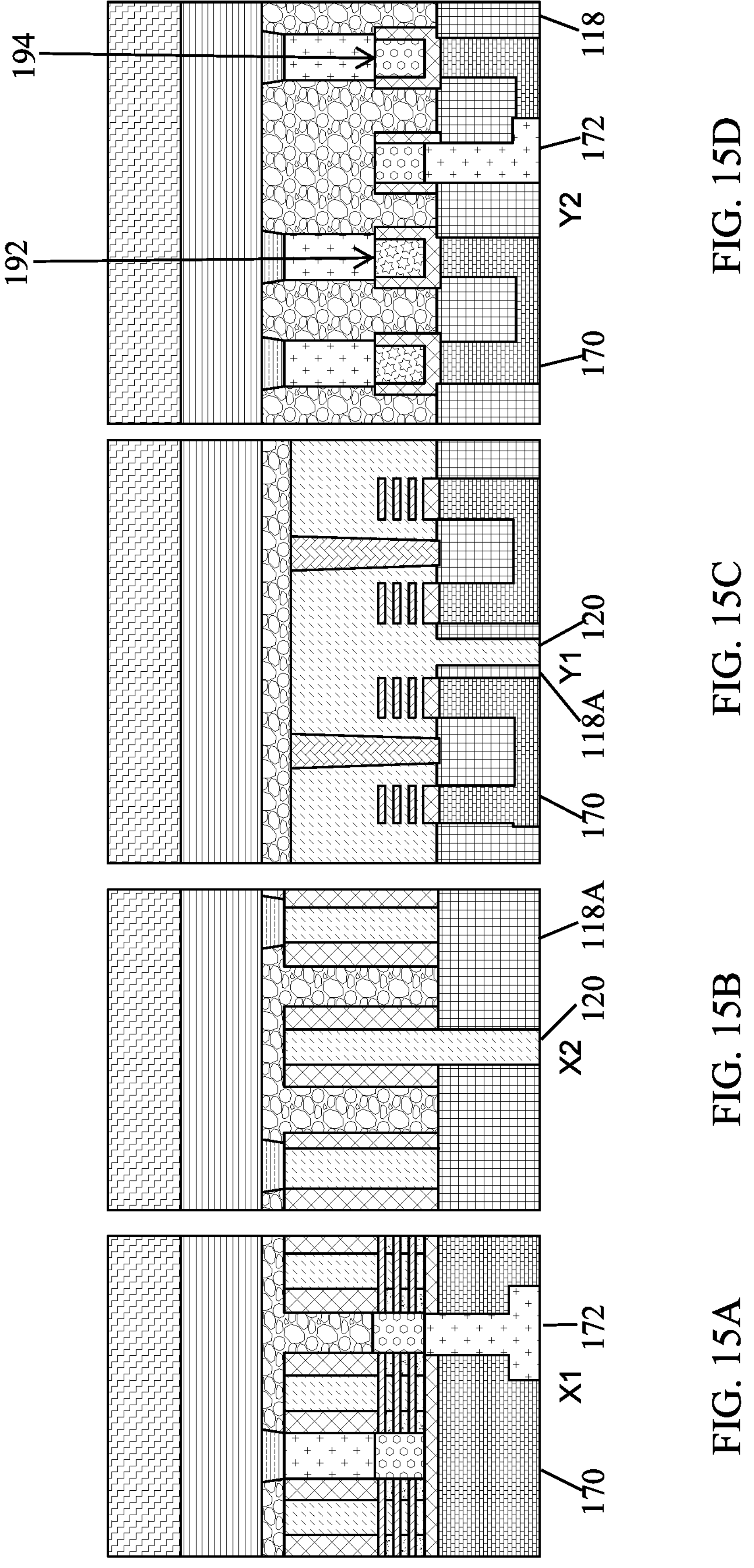
FIGS. 15A through 15D depict cross-sectional views of the semiconductor structure of FIG. 1, taken along lines X1, X2, Y1 and Y2, respectively, illustrating sacrificial placeholder removal and backside contact formation, as used in a process according to an illustrative embodiment.

FIG. 5 illustrates a cross-sectional view taken along line Y1 of FIG. 1, where the OPL 116 (see FIG. 4) may be removed and STI fill 118 may be applied to isolate device from device. The STI fill 118 can include a deep STI fill 118A within the deep STI patterning 119 between the NFET 103 and the PFET 105 (see FIG. 1), a shallow STI fill 118C and end deep STI fills 118B, as further described below. The hardmask layer 112 is then removed.

FIGS. 6A through 6D illustrate cross-sectional views taken along lines X1, X2, Y1, and Y2, respectively, of FIG. 1, where the SiGe55 layer 110B can be removed and a BDI layer 122 can be formed. A dummy gate 120 can be formed over the STI fill 118 and inner spacers 130 may be patterned to define the dummy gate 120. The inner spacers 130 and the BDI layer 122 may be formed from a dielectric. A gate hardmask 124 can be applied over the dummy gate 120. An OPL 126 may be applied on the gate hardmask 124 as shown. A placeholder region 128 can be patterned in a selective SiGe indentation 128A.

FIGS. 7A through 7D illustrate cross-sectional views taken along lines X1, X2, Y1, and Y2, respectively, of FIG. 1, where a placeholder 132 may be disposed within the placeholder region 128. The OPL 126 can be removed and a drain epitaxial growth 134 (also referred to an n-epi) and a source epitaxial growth 136 (also referred to a μ-epi) are formed.

FIGS. 8A through 8D illustrate cross-sectional views taken along lines X1, X2, Y1, and Y2, respectively, of FIG. 1, where ILD fill 140 is added along with CMP to remove the gate hardmask 124. Then, gate cuts 142 are formed in the dummy gate 120 to the STI fill 118. Finally, the dummy gate 120 is removed and the sacrificial layers 110, typically formed of SiGe, are removed.

FIGS. 9A through 9D illustrate cross-sectional views taken along lines X1, X2, Y1, and Y2, respectively, of FIG. 1, where OPL 148 can be added and gate clock signal patterning 150 can be etched through the STI fill 118 and into the semiconductor layer 108C immediate above the etch stop layer 106.

FIGS. 10A through 10D illustrate cross-sectional views taken along lines X1, X2, Y1, and Y2, respectively, of FIG. 1, where OPL 148 can be removed and HKMG 158 can be formed in its place to form a clock signal line contact via 158A that is surrounded by the deep STI fill 118A.

FIGS. 11A through 11D illustrate cross-sectional views taken along lines X1, X2, Y1, and Y2, respectively, of FIG. 1, where middle of line (MOL) contact areas 160 can be formed and additional ILD 164 may be placed on the previously applied ILD fill 140. Vias 162 can be formed to connect the MOL contact areas 160 to a BEOL interconnect 166. Finally, a carrier wafer 168 can be bonded on top of the BEOL interconnect 166.

FIGS. 12A through 12D illustrate cross-sectional views taken along lines X1, X2, Y1, and Y2, respectively, of FIG. 1, where the wafer can be flipped to permit work on the opposite side thereof (that is, the side opposite the carrier wafer 168). Substrate grinding and CMP can be performed, followed by a wet etch that removes the substrate 104 and stops at the etch stop layer 106.

FIGS. 13A through 13D illustrate cross-sectional views taken along lines X1, X2, Y1, and Y2, respectively, of FIG. 1, where the etch stop layer 106 is removed, along with the semiconductor layer 108C and the SiGe30 layer 110A. After this removal, the BDI layer 122, the STI 118, the HKMG 158 and the placeholder 132 are exposed.

FIGS. 14A through 14D illustrate cross-sectional views taken along lines X1, X2, Y1, and Y2, respectively, of FIG. 1, where a BEOL ILD 170 is deposited, and CMP is performed.

Figures 16A, 16B, 16C, 16D:
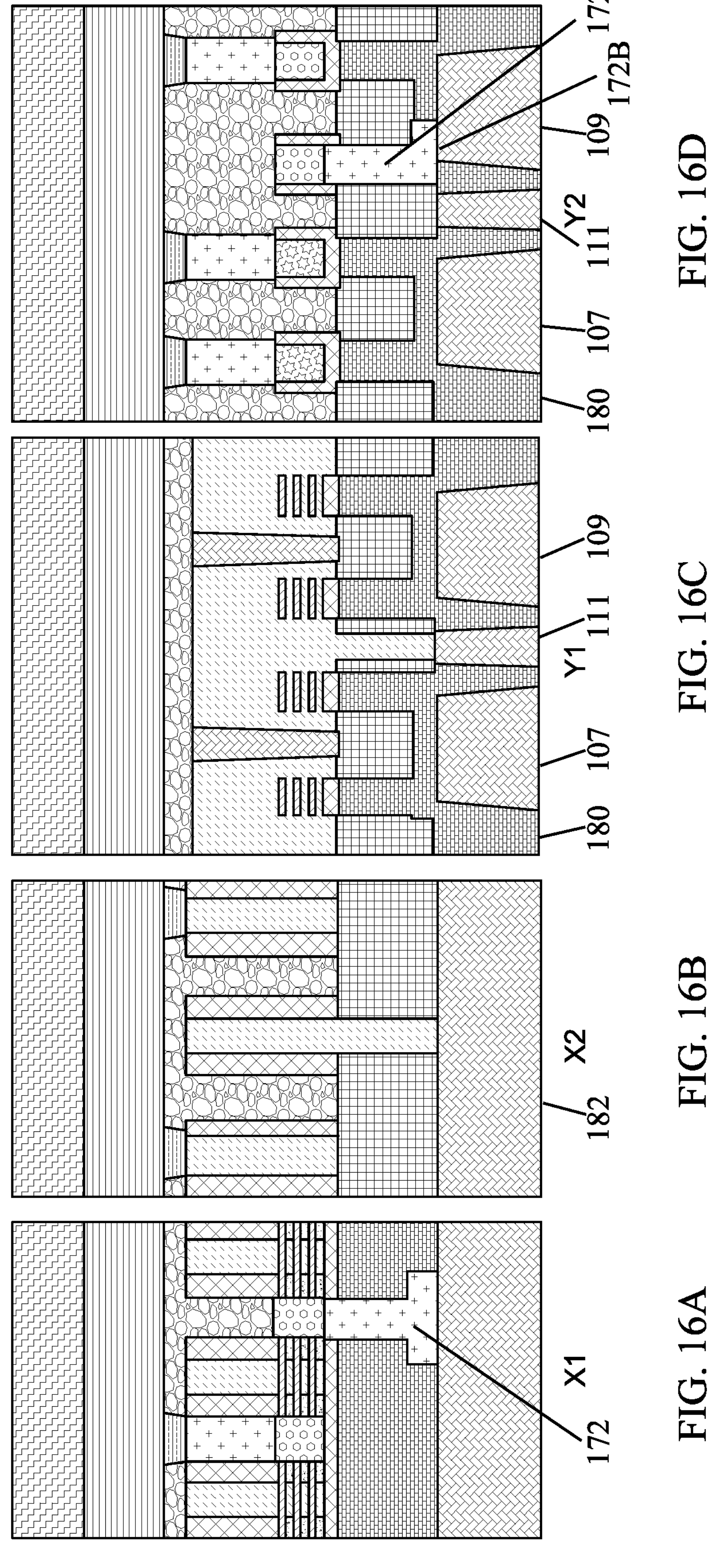
FIGS. 16A through 16D depict cross-sectional views of the semiconductor structure of FIG. 1, taken along lines X1, X2, Y1 and Y2, respectively, illustrating backside ILD and backside power rail/signal line formation, as used in a process according to an illustrative embodiment.

FIGS. 15A through 15D illustrate cross-sectional views taken along lines X1, X2, Y1, and Y2, respectively, of FIG. 1, where the placeholder 132 is removed and a backside contact 172 is formed in its place. The backside contact 172 can connect a source epitaxial growth 132 and/or a drain epitaxial growth 134 to a $V_{SS}$ line 107 (source line) or a $V_{DD}$ line 109 (drain line) at a drain line contact end 172B thereof, as shown in FIG. 16D.

FIGS. 16A through 16D illustrate cross-sectional views taken along lines X1, X2, Y1, and Y2, respectively, of FIG. 1, where additional backside ILD 180 is deposited and the backside power rail and signal lines are formed, including the $V_{SS}$ line 107, the $V_{DD}$ line 109 and the clock signal line 111 (see also, FIG. 1).

FIGS. 17A through 17D illustrate cross-sectional views taken along lines X1, X2, Y1, and Y2, respectively, of FIG. 1, where the backside power distribution network 190 (BSPDN 190) can be formed to complete the fabrication process.

Figures 17A, 17B, 17C, 17D:
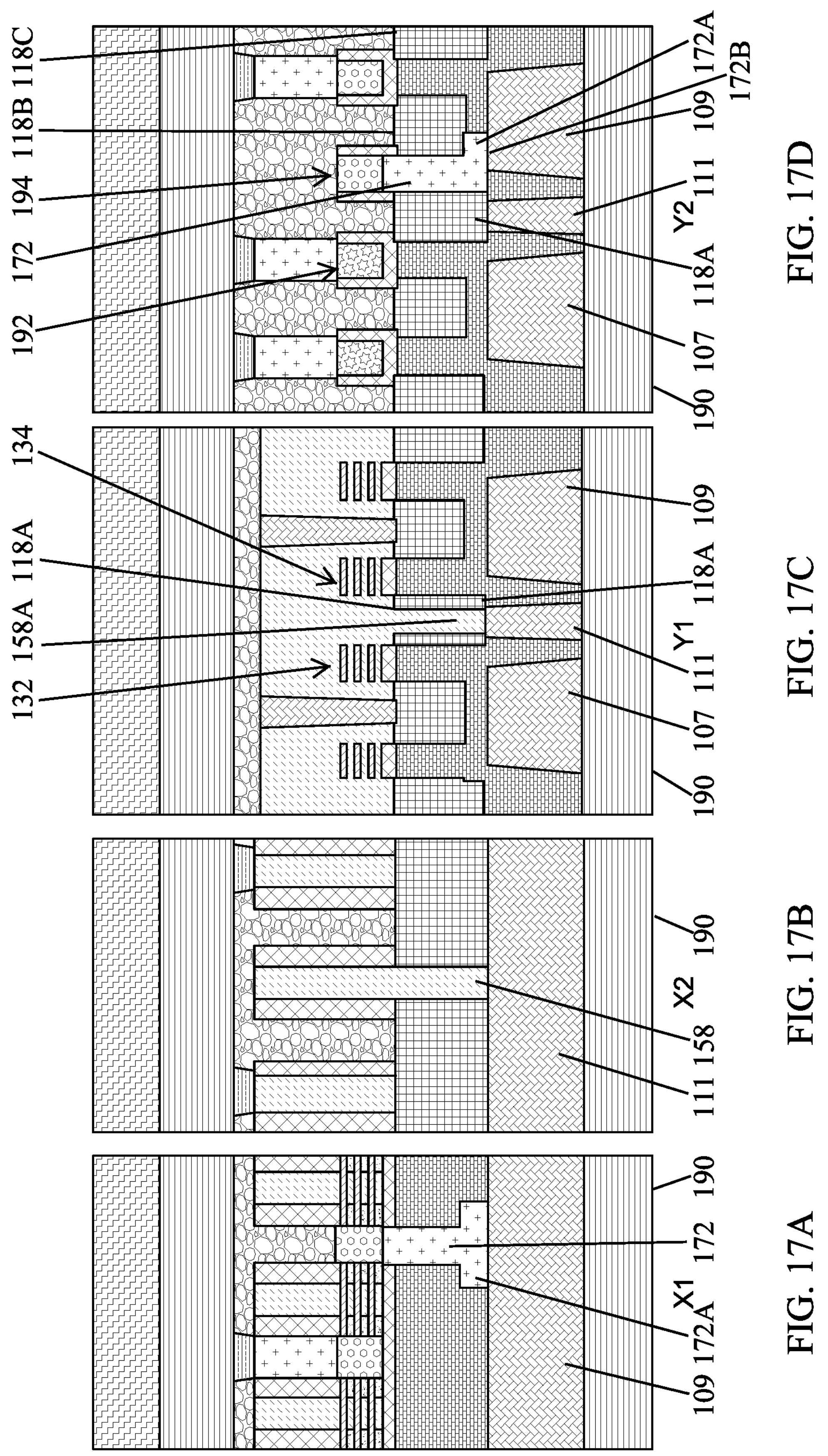
FIGS. 17A through 17D depict cross-sectional views of the semiconductor structure of FIG. 1, taken along lines X1, X2, Y1 and Y2, respectively, illustrating formation of the BSPDN, as used in a process according to an illustrative embodiment.

As can be seen, the process described above results in both a direct backside connection for the drain epitaxial growth 134 (see FIG. 7D) to the BSPDN 190 through backside contact 172 (see FIG. 17D), as well as a direct backside connection for the clock signal line 111 to the BSPDN 190 through the clock signal line contact via 158A (see FIG. 17C). The direct backside connection through the backside contact 172 (see FIGS. 17A and 17D) can include an extension 172A shifted towards the $V_{DD}$ line 109 (see FIG. 18D) to prevent the $V_{DD}$ line 109 to clock signal line 111 shorting. The deep STI fill 118A can prevent direct backside contact between the $V_{DD}$ line 109 and the clock signal line 111 and at least one N-to-P side of the direct backside source and/or drain contact is contacted with a shallow STI fill 118C, while at least one N-to-N side or P-to-P side of the direct backside source and/or drain contact is contacted with an end deep STI fill 118B (see FIG. 17D).

While the Figures illustrate a backside contact between the drain ($V_{DD}$ line 109) and drain epitaxial growth 134, it should be understood that a similar backside contact structure can be provided between the VSS line 107 and the source epitaxial growth 136.

Thus, the structures and methods of the present disclosure can extend direct backside contact area when connected to $V_{DD}/V_{SS}$ and clock signal lines to reduce contact resistance while preventing shorting.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device comprising:

a direct backside contact between a drain line on a backside of the semiconductor device and a drain epitaxial growth of the semiconductor device; and a clock signal line contact via connecting a gate to a clock signal line at the backside of the semiconductor device, wherein the clock signal line contact via is surrounded by a deep shallow trench isolation (STI) fill.

2. The semiconductor device of claim 1, wherein:

at least one of an N-to-P side of the direct backside contact is connected with a shallow STI fill; and at least one of an N-to-N side or a P-to-P side of the direct backside contact is contacted with the deep STI fill.

3. The semiconductor device of claim 1, further comprising an extension, integral with the direct backside contact, formed at a drain line contact end of the direct backside contact, the extension providing a contact surface area configured to electrically connect the direct backside contact with the drain line.

4. The semiconductor device of claim 3, wherein the extension extends in a first direction toward a central longitudinal axis of the drain line.

5. The semiconductor device of claim 4, wherein the extension extends in a second direction parallel with the central longitudinal axis.

6. The semiconductor device of claim 1, wherein the deep STI fill prevents shorting between the direct backside contact and the clock signal line contact via.

7. The semiconductor device of claim 1, wherein the drain epitaxial growth has an offset from being directly above the drain line.

8. The semiconductor device of claim 7, wherein the offset spaces the drain line apart from the clock signal line in a backside power rail.

9. A semiconductor device comprising:

a direct backside contact between a drain line on a backside of the semiconductor device and a drain epitaxial growth of the semiconductor device;

a clock signal line contact via connecting a gate to a clock signal line on the backside of the semiconductor device; and an extension, integral with the direct backside contact, formed at a drain line contact end of the direct backside contact, the extension providing a contact surface area for electrically connecting the direct backside contact with the drain line.

10. The semiconductor device of claim 9, wherein the extension extends in a first direction toward a central longitudinal axis of the drain line.

11. The semiconductor device of claim 10, wherein the extension extends in a second direction parallel with the central longitudinal axis.

12. The semiconductor device of claim 9, further comprising a deep shallow trench isolation (STI) fill surrounding the clock signal line contact via, wherein the deep STI fill is configured to prevent shorting between the direct backside contact and the clock signal line contact via.

13. The semiconductor device of claim 12, wherein:

at least one of an N-to-P side of the direct backside contact is connected with a shallow STI fill; and at least one of an N-to-N side or a P-to-P side of the direct backside contact is contacted with the deep STI fill.

14. The semiconductor device of claim 9, wherein the drain epitaxial growth has an offset from being directly above the drain line.

15. The semiconductor device of claim 14, wherein the offset spaces the drain line apart from the clock signal line in a backside power rail.

16. A semiconductor device comprising:

a direct backside contact between a drain line on a backside of the semiconductor device and a drain epitaxial growth of the semiconductor device;

a clock signal line contact via connecting a gate to a clock signal line on the backside of the semiconductor device;

a deep STI fill surrounding the clock signal line contact via; and an extension, integral with the direct backside contact, formed at a drain line contact end of the direct backside contact, the extension providing a contact surface area configured to electrically connect the direct backside contact with the drain line, wherein the extension extends in a first direction toward a central longitudinal axis of the drain line; and the extension extends in a second direction parallel with the central longitudinal axis.

17. The semiconductor device of claim 16, further comprising:

at least one of an N-to-P side of the direct backside contact is connected with a shallow STI fill; and at least one of an N-to-N side or a P-to-P side of the direct backside contact is contacted with the deep STI fill.

18. The semiconductor device of claim 16, wherein the drain epitaxial growth has an offset from being directly above the drain line.

19. The semiconductor device of claim 18, wherein the offset spaces the drain line from the clock signal line in a backside power rail.

20. The semiconductor device of claim 16, wherein the deep STI fill prevents shorting between the direct backside contact and the clock signal line contact via.

* * * * *